United States Patent
Tabatowski-Bush et al.

(10) Patent No.: US 9,630,520 B2
(45) Date of Patent: Apr. 25, 2017

(54) CIRCUIT AND METHOD FOR BATTERY LEAKAGE DETECTION

(71) Applicant: Ford Global Technologies, LLC, Dearborn, MI (US)

(72) Inventors: Benjamin A. Tabatowski-Bush, South Lyon, MI (US); John Peter Bilezikjian, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/595,478

(22) Filed: Jan. 13, 2015

(65) Prior Publication Data

US 2016/0200209 A1 Jul. 14, 2016

(51) Int. Cl.
| | |
|---|---|
| *B60L 11/18* | (2006.01) |
| *B60L 3/00* | (2006.01) |
| *B60L 3/12* | (2006.01) |
| *B60L 11/14* | (2006.01) |
| *G01R 27/14* | (2006.01) |
| *B60L 9/00* | (2006.01) |

(52) U.S. Cl.
CPC ......... *B60L 11/1861* (2013.01); *B60L 3/0069* (2013.01); *B60L 3/12* (2013.01); *B60L 11/14* (2013.01); *B60L 11/1816* (2013.01); *G01R 27/14* (2013.01); *B60L 9/00* (2013.01); *B60L 2240/545* (2013.01); *B60L 2240/547* (2013.01); *B60L 2240/549* (2013.01); *Y02T 10/70* (2013.01); *Y02T 10/7005* (2013.01); *Y02T 10/705* (2013.01); *Y02T 10/7044* (2013.01); *Y02T 10/7072* (2013.01); *Y02T 10/7077* (2013.01); *Y02T 90/14* (2013.01)

(58) Field of Classification Search
CPC ........ B60L 9/00; B60L 11/00; B60L 11/1861; B60W 20/00; B60W 10/06; B60W 10/08; Y02T 10/6286; B60K 6/445
USPC .......................................................... 701/22
See application file for complete search history.

(56) References Cited

U.S. PATENT DOCUMENTS

| | | | | |
|---|---|---|---|---|
| 3,987,425 | A * | 10/1976 | Lawton ..................... | B60L 3/00 340/530 |
| 4,947,155 | A * | 8/1990 | Morrow .................... | B60L 3/00 340/627 |
| 5,382,946 | A * | 1/1995 | Gale ..................... | G01R 31/006 324/510 |
| 5,481,194 | A * | 1/1996 | Schantz .................. | B60L 1/003 324/509 |
| 6,594,987 | B2 | 7/2003 | Uranishi | |
| 7,263,416 | B2 * | 8/2007 | Sakurai ................. | F02D 41/062 307/9.1 |
| 8,040,139 | B2 | 10/2011 | Plagens et al. | |

(Continued)

*Primary Examiner* — Atul Trivedi
(74) *Attorney, Agent, or Firm* — David Kelley; Brooks Kushman P.C.

(57) ABSTRACT

A battery management system includes a switching element configured to selectively couple a resistive network in parallel with a capacitor that couples a voltage bus and a ground reference. A controller is programmed to, in response to activating the switching element for a predetermined time, output a diagnostic according to a leakage resistance that is based on a time associated with a predetermined change in a voltage across the capacitor. A time constant is derived from the voltage response and the leakage resistance is derived from the time constant.

20 Claims, 3 Drawing Sheets

(56) References Cited

U.S. PATENT DOCUMENTS

| | | | |
|---|---|---|---|
| 8,417,402 B2 * | 4/2013 | Basir | B60L 11/1816 180/65.21 |
| 8,791,702 B2 | 7/2014 | Miura et al. | |
| 9,199,538 B2 * | 12/2015 | Masuda | B60L 3/0069 |
| 2009/0230766 A1 * | 9/2009 | Miyama | H02J 7/1423 307/10.7 |
| 2009/0295401 A1 * | 12/2009 | Kamata | G01R 31/006 324/509 |
| 2010/0207635 A1 * | 8/2010 | Plagens | B60L 3/0023 324/509 |
| 2011/0093223 A1 * | 4/2011 | Quet | H01M 8/04656 702/60 |
| 2011/0234176 A1 * | 9/2011 | Nakamura | H02M 1/08 320/166 |
| 2012/0221269 A1 * | 8/2012 | Wanner | G01R 27/18 702/65 |
| 2013/0245869 A1 * | 9/2013 | Nishida | B60L 3/0069 701/22 |

* cited by examiner

CIRCUIT AND METHOD FOR BATTERY LEAKAGE DETECTION

TECHNICAL FIELD

This application generally relates to leakage current detection for vehicles including a high-voltage bus.

BACKGROUND

A hybrid-electric or all-electric vehicle includes a traction battery constructed of multiple battery cells in series and/or parallel. The traction battery provides power for vehicle propulsion and accessory features. The traction battery typically operates at high voltages. Under normal conditions, a high-voltage system is designed to have a high resistance between the traction battery terminals and ground. However, it is possible during operation that the leakage resistance decreases for a number of reasons. Many high-voltage systems include circuitry to monitor and detect the presence of an abnormal leakage current within the traction battery.

SUMMARY

A vehicle includes a capacitor coupling a voltage bus and a chassis of the vehicle and at least one controller. The at least one controller is programmed to, in response to activating a switching element to couple a resistive network in parallel with the capacitor for a predetermined time, output a diagnostic according to a leakage resistance that is based on a time associated with a predetermined change in a voltage across the capacitor. The predetermined change may be defined by a product of (1−1/e), where e is Euler's number, and a magnitude of a difference between an initial voltage across the capacitor and a final voltage across the capacitor. The initial voltage may be the voltage at a time immediately after activating the switching element. The final voltage may be the voltage at the predetermined time, and wherein the predetermined time is such that a rate of change of the voltage with respect to time is approximately zero at the predetermined time. The leakage resistance may be further based on a capacitance of the capacitor. The resistive network may include a current limiting resistor and a voltage measurement resistor connected in series, wherein the voltage across the capacitor is proportional to a voltage across the voltage measurement resistor. The leakage resistance may be a parallel combination of a first leakage resistance between a positive terminal of the voltage bus and the chassis of the vehicle and a second leakage resistance between a negative terminal of the voltage bus and the chassis of the vehicle. The at least one controller may be further programmed to output the diagnostic when the leakage resistance is less than a predetermined resistance.

A battery management system includes a switching element configured to selectively couple a resistive network in parallel with a capacitor that couples a voltage bus and a ground reference and at least one controller. The at least one controller is programmed to, in response to the coupling exceeding a predetermined time, output a diagnostic according to a leakage resistance that is based on a time associated with a predetermined change in a voltage across the capacitor. The resistive network may include a current limiting resistor and a voltage measurement resistor connected in series, wherein the voltage across the capacitor is proportional to a voltage across the voltage measurement resistor. The predetermined change may be defined by a product of (1−1/e), where e is Euler's number, and a magnitude of a difference between an initial voltage across the capacitor and a final voltage across the capacitor. The initial voltage may be the voltage at a time immediately after the coupling. The final voltage may be the voltage at the predetermined time, and wherein the predetermined time is such that a rate of change of the voltage with respect to time is approximately zero at the predetermined time. The leakage resistance may be further based on a capacitance of the capacitor. The at least one controller may be further programmed to activate the switching element in response to a signal indicative of an end of an ignition cycle. The leakage resistance may be a parallel combination of a first leakage resistance between a positive terminal of the voltage bus and the ground reference and a second leakage resistance between a negative terminal of the voltage bus and the ground reference. The at least one controller may be further programmed to output the diagnostic when the leakage resistance value is less than a predetermined resistance.

A method includes coupling, by a controller, a resistor network in parallel with a capacitor that couples a voltage bus and a chassis of a vehicle for a predetermined time. The method further includes outputting, by the controller, a leakage resistance value based on a time for a voltage across the capacitor to change by a predetermined amount. The predetermined amount may be defined by a product of (1−1/e), where e is Euler's number, and a magnitude of a difference between an initial voltage and a final voltage. The final voltage may be less than the initial voltage.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
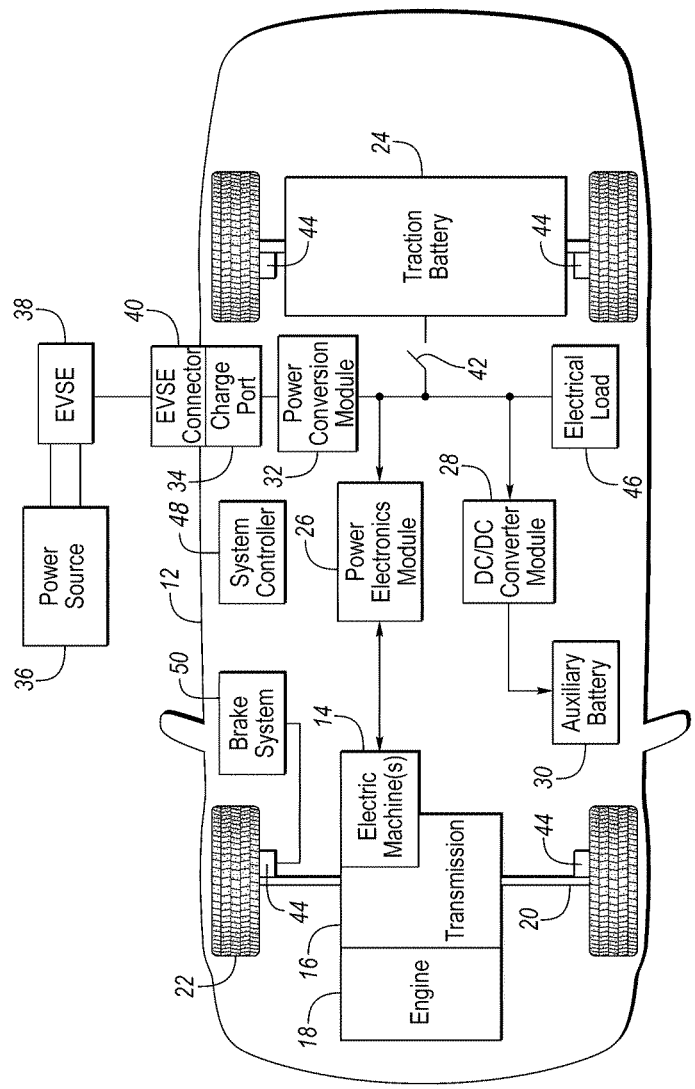
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. The vehicle battery pack 24 typically provides a high voltage DC output. The traction battery 24 is electrically connected to one or more power electronics modules 26. One or more contactors 42 may isolate the traction battery 24 from other components when opened and connect the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may operate using a three-phase AC current. The power electronics module 26 may convert the DC voltage to a three-phase AC current for use by the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to the electric machine 14 and the engine 18 may not be present.

In addition to providing energy for propulsion, the fraction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads 46, such as compressors and electric heaters, may be connected directly to the high-voltage without the use of a DC/DC converter module 28. The low-voltage systems may be electrically connected to an auxiliary battery 30 (e.g., 12V battery).

The vehicle 12 may be an electric vehicle or a plug-in hybrid vehicle in which the fraction battery 24 may be recharged by an external power source 36. The external power source 36 may be a connection to an electrical outlet that receives utility power. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be connected to the high-voltage bus. The electrical loads 46 may have an associated controller that operates and controls the electrical loads 46 when appropriate. Examples of electrical loads 46 may be a heating module or an air-conditioning module.

The various components discussed may have one or more associated controllers to control and monitor the operation of the components. The controllers may communicate via a serial bus (e.g., Controller Area Network (CAN)) or via discrete conductors. A system controller 48 may be present to coordinate the operation of the various components.

Figure 2:
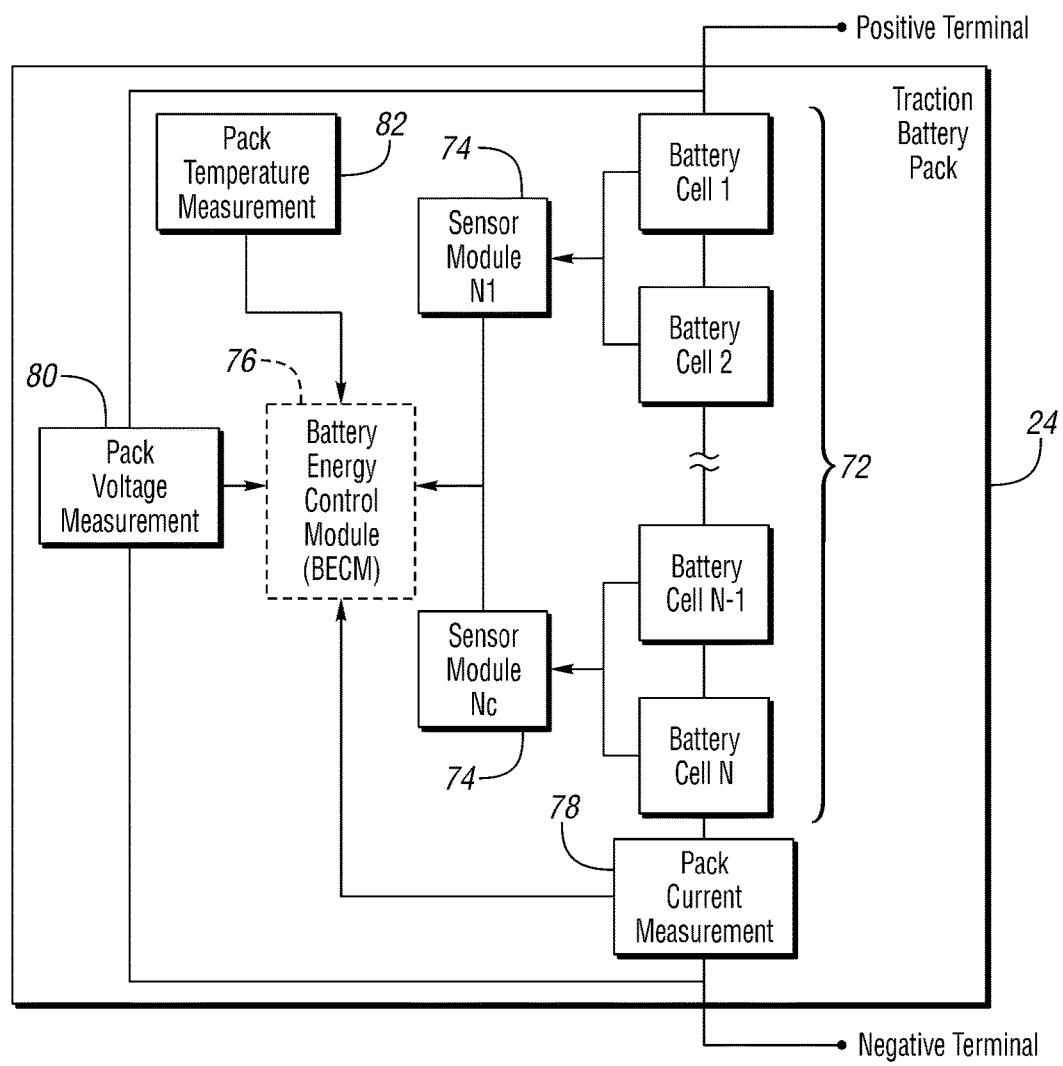
FIG. 2 is a diagram of an exemplary battery pack arrangement comprised of multiple cells, and monitored and controlled by a Battery Energy Control Module.

The traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a series configuration of N battery cells 72. Other battery packs 24, however, may be composed of any number of individual battery cells connected in series or parallel or some combination thereof. A battery management system may have a one or more controllers, such as a Battery Energy Control Module (BECM) 76 that monitors and controls the performance of the traction battery 24. The BECM 76 may include sensors and circuitry to monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. The battery management system may use a sensor module 74 to measure the battery cell 72 characteristics. Depending on the capabilities, the sensor module 74 may include sensors and circuitry to measure the characteristics of one or multiple of the battery cells 72. The battery management system may utilize up to $N_c$ sensor modules or Battery Monitor Integrated Circuits (BMIC) 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals. The BECM 76 may also include circuitry to interface with the one or more contactors 42 to open and close the contactors 42.

Figure 3:
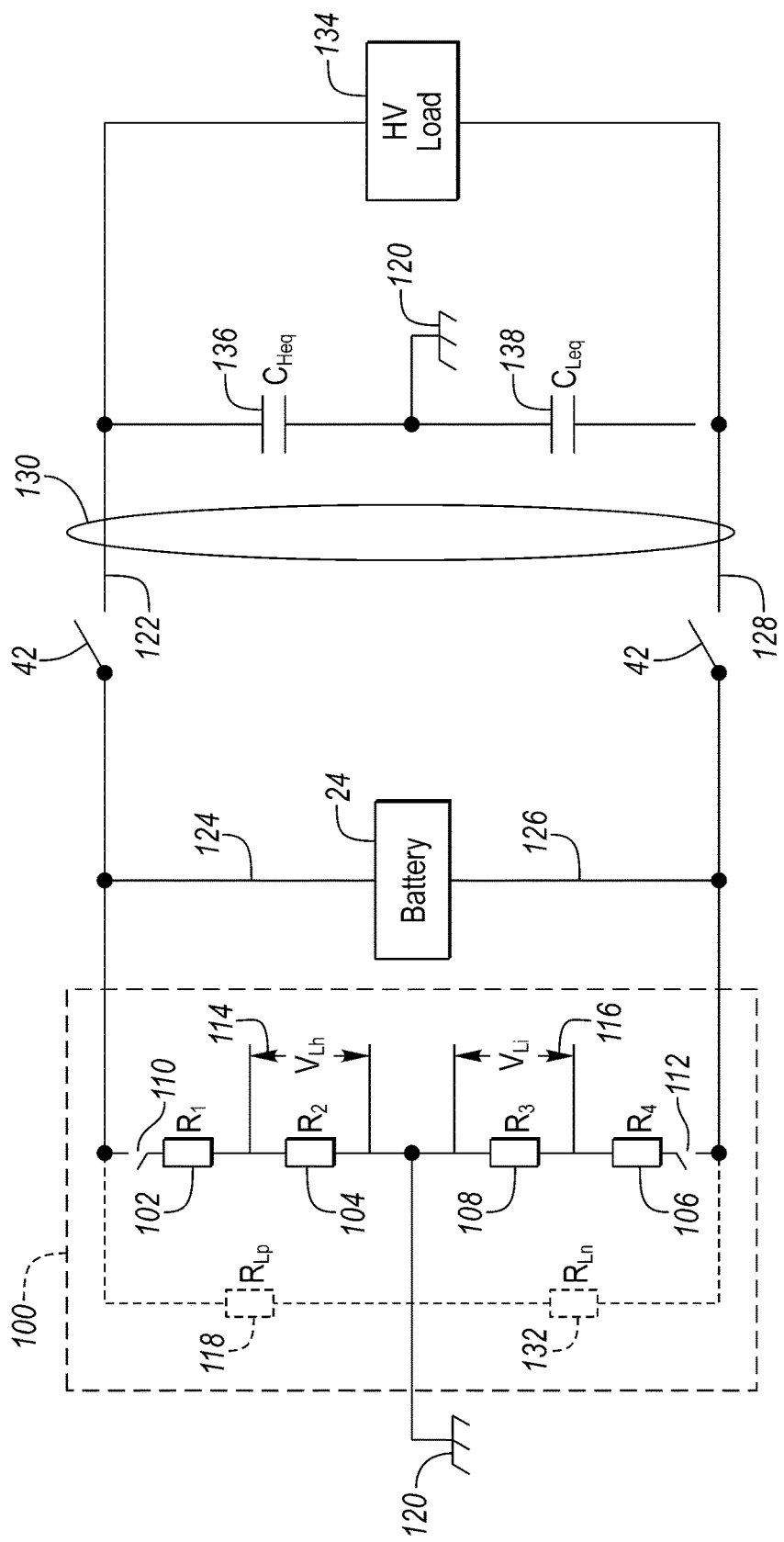
FIG. 3 is a diagram of an exemplary circuit for detecting a leakage resistance in a system coupled to a traction battery.

FIG. 3 depicts a diagram of a possible system for detecting electrical isolation in a vehicle 12. The traction battery 24 may have a positive terminal 124 and a negative terminal 126. The traction battery terminals 124, 126 may be coupled to contactors 42 that selectively connect the traction battery terminals 124, 126 to conductors 122, 128 that are part of a high-voltage bus 130. The high-voltage bus 130 may couple the high-voltage from the traction battery 24 to high-voltage loads 134 in the vehicle (e.g., Power Electronics Module 26). The battery management system may monitor the connections to ensure that electrical isolation between the traction battery terminals 124, 126 and a chassis ground 120 is maintained. The chassis ground 120 may be a common or ground reference point to which electrical devices are electrically connected to (e.g., a chassis of the vehicle 12). The electrical isolation may be described as a high-side leakage resistance 118 between the chassis ground 120 and a positive terminal 124 of the traction battery 24. The electrical isolation may also include a low-side leakage resistance 132 between the chassis ground 120 and a negative terminal 126 of the traction battery 24. Under normal conditions, the leakage resistances 118, 132 may have a relatively large value such that little or no leakage current flows through the chassis ground 120. Note that the leakage resistances may actually occur at various locations within the high-voltage system. Various government regulations and industry standards may specify a minimum value for electrical isolation in a high-voltage system. For example, an electrical isolation of no less than 500 ohms/Volt between the battery terminals (124, 126) and the chassis ground 120 may be specified.

The vehicle 12 may include leakage detection circuitry 100 for detecting the presence of electrical isolation issues. Leakage detection circuitry 100 may be connected to each terminal (124, 126) of the traction battery 24. When the contactors 42 are closed, the leakage detection circuitry 100 may be selectively coupled to the terminals of the high-voltage bus 130. The leakage detection circuitry 100 may include a resistive network that may be selectively coupled between the terminals of the high-voltage bus 130 and the chassis ground 120. The leakage detection circuitry 100 may include one or more voltage measurement resistors (104, 108) that are electrically connected to the chassis ground 120. One or more current limiting resistors (102, 106) may be electrically connected to the high-voltage bus 130 or terminals 124, 126 of the traction battery 24. The voltage measurement resistors 104, 108 and an associated current limiting resistor 102, 106 may be connected in series. One or more switching elements 110, 112 may selectively electrically couple the battery terminals 124, 126 to the associated current limiting resistor 102, 106 and the associated voltage measurement resistor 104, 108. The switching elements 110, 112 may be a solid-state device or a relay. The leakage detection circuit 100 depicted may be described as a voltage divider network. Other configurations of the leakage detection circuit 100 are possible.

The resistance values may be selected to ensure that a small current flows during the leakage test. The resistance values may also be selected to provide a sufficient range of voltages across the voltage measurement resistors 104, 108 over the expected leakage currents.

The resistance values of the voltage measurement resistors (104, 108) and the current limiting resistors (102, 106) may be chosen such that the voltage across the voltage measurement resistors (104, 108) may be sampled by a controller 76. The controller 76 may include electrical isolation, filtering, and scaling circuitry to process the voltage prior to converting the signal using an A/D converter. The leakage detection circuitry 100 may be electrically coupled to each conductor 122, 128 of the high-voltage bus 130. In some configurations, the voltage measurement resistors 104, 108 may have the same value (e.g., $R_2=R_3$) and the current limiting resistors 102, 106 may have the same value (e.g., $R_1=R_4$).

The electrical isolation may be represented as a resistance 118, 132 between a conductor 122, 128 of the high-voltage bus 130 and the chassis ground 120. The leakage detection circuit 100 provides a mechanism to estimate the leakage resistances 118, 132 between the conductors 122, 128 and the chassis ground 120 to detect a leakage path. When the switching elements 110, 112 electrically couple the resistors to the high voltage bus 130, a leakage path may be formed that includes the associated leakage resistances 118, 132. Since the traction battery 24 is not referenced to chassis ground 120, any current flow passes through the leakage resistances 118, 132 in order to complete the circuit. Assuming infinite leakage resistances (118, 132), no current would flow through the leakage path and the voltage across the voltage measurement resistors 104, 108 would indicate zero volts. At the other extreme, assuming one of the leakage resistances 118, 132 is zero, the voltage across the voltage measurement resistor 104, 108 would indicate a voltage that is the battery voltage reduced by the operation of the voltage divider.

The vehicle 12 may include one or more capacitors 136, 138 electrically connected between conductors 122, 128 of the high voltage bus 130 and the chassis ground 120. For example, each high-voltage load 134 connected to the high-voltage bus 130 may include associated capacitors. The capacitors may be referred to as Y-capacitors. A high-side capacitor 136 represents the parallel combination of capacitors or aggregate capacitance between the positive conductor 122 of the high-voltage bus 130 and the chassis ground 120. A low-side capacitor 138 represents the parallel combination of capacitors or aggregate capacitance between the negative conductor 128 of the high-voltage bus 130 and the chassis ground 120.

The switching elements 110, 112 of the leakage detection circuit 100 may be periodically switched and monitored to detect a change in the electrical isolation of the traction battery 24 and the high-voltage bus 130.

A first mode of operation may be a circuit check. In this mode, both of the switching elements 110, 112 may be closed at the same time. The controller 76 may measure the overall battery voltage using a voltage measurement circuit 80 as described previously. While both of the switching elements 110, 112 are closed, the voltages 114, 116 across each of the voltage measurement resistors 104, 108 may be measured. When both switching elements 110, 112 are closed, a current may flow that is the battery voltage divided by the sum of the resistances values 102, 104, 106, 108. The sum of the voltages across the voltage measurement resistors may be expressed as $$V_{Lh} + V_{Ll} = \frac{(R_2 + R_3) * \text{Pack Voltage}}{(R_1 + R_2 + R_3 + R_4)} = K_1 * \text{Pack Voltage} \quad (1)$$

Assuming that the circuit if properly functioning, equation (1) will be satisfied. Circuit operation may be checked by measuring the pack voltage and applying the factor that is based on the leakage circuit resistance values ($K_1$). The controller may measure the voltages 114, 116 across the voltage measurement resistors 104, 108 and compute the sum. A circuit issue may be identified if the sum of the voltages and the computed value based on the measured pack voltage vary by more than a predetermined percentage (e.g., 10%). Under normal conditions, the sum and the computed value should be approximately equal.

A second mode of operation may be an electrical leakage detection mode. The electrical leakage detection mode may identify a loss of isolation between the high-voltage bus 130 and the chassis ground 120. There may be two types of isolation breach that may be detected. A first isolation breach may be a high-side leakage, which is represented by the resistance 118 between the positive conductor 122 of the high-voltage bus 130 and the chassis ground 120. A second isolation breach may be a low-side leakage, which may be represented by the resistance 132 between the negative conductor 128 of the high-voltage bus 130 and the chassis ground 120.

An overall leakage resistance may be represented by the parallel combination of the high-side leakage resistance 118 and the low-side leakage resistance 132. The parallel combination may be expressed as an equivalent resistance value according to $$R_{equiv} = \frac{R_{Lp} R_{Ln}}{R_{Lp} + R_{Ln}} \quad (2)$$

A loss of isolation may be detected when the value of equivalent leakage resistance, $R_{equiv}$, is less than a predetermined resistance value. When a loss of isolation is detected, the controller may perform mitigating operations, such as warning the operator of the condition and preventing operation of the vehicle. As the values of the leakage resistances are not known, the controller may implement a strategy to estimate the value of the equivalent leakage resistance.

When the contactors 42 are closed, the high-side capacitor 136 and the low-side capacitor 138 will charge or discharge to a voltage based on the high-side leakage resistance 118 and the low-side leakage resistance 132. When one of the switching elements, S1 110 or S2 112 is closed, the capacitors 136, 138 will charge or discharge based on the combination of the leakage resistances 118, 132 and the leakage measurement circuit resistances 102, 104, 106, 108. Since the leakage circuit resistances 102, 104, 106, 108 and the capacitances 136, 138 are known, it is possible to determine the equivalent leakage resistance based on the change in the measured voltage. The voltage across the capacitors 136, 138 will rise or decay from an initial voltage value immediately following closure of the switching element 110, 112 to a final voltage value that is based on the resistance values in the circuit. The voltage across the voltage measurement resistor 104, 108 is proportional to the voltage across the associated capacitor 136, 138. A time constant of the rise or decay may be determined as the time that it takes the voltage to change by a predetermined amount that may be defined by (1−1/e) percent of the difference between the initial and final voltage values, where e is Euler's number.

The equations for analyzing the leakage measurement are presented for when S1 110 is closed. Assuming a balanced system, the equations are the same for when S2 112 is closed. The voltage of the positive terminal 122 of the voltage bus 130 relative to the chassis ground 120 before the switching element S1 110 is closed (e.g., S1 110 and S2 112 are open) may be expressed as $$V_{Vtop-Gnd} = V_1 - V_1\left(\frac{R_{Ln}}{R_{Lp} + R_{Ln}}\right) = V_1\left(\frac{R_{Lp}}{R_{Lp} + R_{Ln}}\right) \quad (3)$$

A similar expression may be derived for the voltage of the negative terminal 128 of the voltage bus 130 relative to chassis ground 120. The effective resistance observed between the positive terminal 122 and the chassis ground 120 is the parallel combination of the leakage resistances ($R_{equiv}$). When the switching element S1 110 is closed, the effective resistance observed between the positive terminal 122 and the chassis ground 120 is the parallel combination of the high-side leakage resistance 118 and the sum of the leakage measurement circuit resistances 102, 104. The voltage across the capacitance 136 may change after the switching element S1 110 is closed due to the change in the resistances. Any change in the voltage across the capacitance 136 will be with a time constant determined by the effective resistance and the capacitance.

The voltage of the positive terminal 122 of the voltage bus 130 relative to the chassis ground 120 after the switching element S1 110 is closed may be expressed as $$V_{Vtop-Gnd} = \quad (4)$$
$$V_1 - V_1\left(\frac{R_{Ln}}{R_{Lp} \| (R_1 + R_2) + R_{Ln}}\right) = V_1 - V_1\left(\frac{R_{Ln}}{\frac{R_{Lp}(R_1 + R_2)}{(R_{Lp} + R_1 + R_2)} + R_{Ln}}\right)$$

It is observed that the voltage of the positive terminal 122 of the voltage bus 130 relative to the chassis ground 120 may change when the switching element S1 110 is closed. The voltage between the positive terminal 122 and the chassis ground 120 is also the voltage across the high-side capacitor 136. The change in the voltage is controlled by a time constant based on the effective resistance and effective capacitance of the circuit. Note that the voltage of the positive terminal 122 of the voltage bus 130 relative to the chassis ground 120 is also equivalent to the voltage across the high-side leakage measurement resistor network that includes the current limiting resistor 102 and the voltage measurement resistor 104.

The voltage of the positive terminal 122 of the voltage bus 130 relative to the chassis ground 120 may be indirectly measured based on the voltage 114 across the measurement resistance 104. The voltage across the voltage measurement resistor 104 may be computed as $V_{Vtop-Gnd}*(R_2/(R_1+R_2))$. The controller may record the voltage 114 measured across the voltage measurement resistance 104 immediately after closing the switching element S1 110 as the initial voltage. As the voltage changes, the controller may record the voltage value and the time from when switching element S1 110 was closed. After a predetermined time, or a predetermined number of time constants, the voltage may reach a steady-state value. The predetermined time may be selected so that the voltage stabilizes at the predetermined time (e.g., rate of change of the voltage with respect to time is approximately zero).

The time constant may be expressed as a product of the effective resistance and the effective capacitance as follows $$\tau = R_{eff} C_{eff} \quad (5)$$

where $C_{eff}$ is the sum of the capacitance value 136 coupled to the positive terminal 122 and the capacitance value 138 coupled to the negative terminal 128 (e.g., $C_{eff} = C_{Heq} + C_{Leq}$). The effective resistance, $R_{eff}$, is the parallel combination of the equivalent leakage resistance and the sum of the leakage measurement circuit resistances as follows $$R_{eff} = \frac{R_{equiv}(R_1 + R_2)}{R_{equiv} + (R_1 + R_2)} \quad (6)$$

The form of the response to the change in voltage after the switching element S1 110 transitions from opened to closed will be of an exponential form. A voltage decay may be of the form $$V_t = V_{final} + (V_{init} - V_{final}) e^{-t/\tau} \quad (7)$$

where $V_{init} > V_{final}$. The total change in the voltage may be expressed as a function of the difference between the initial voltage and the final voltage, $V_{init} - V_{final}$. At a time that is equivalent to the time constant, $\tau$, the voltage will have changed to $V_{final} + (V_{init} - V_{final})*1/e$. This value is such that only 1/e (that is, 36.79 percent) of the expected voltage change remains. The time constant, $\tau$, may be computed by measuring the voltage over time and determining a time that it takes to for the voltage to change by 63.21 percent (that is, 1−1/e) of the total change (e.g., $V_{init} - V_{final}$). The time constant may then be equated to the $R_{eff}$ and $C_{eff}$ using the above equation. Since the capacitance values are known, the equivalent leakage resistance may be computed as $$R_{equiv} = \frac{\tau(R_1 + R_2)}{(R_1 + R_2)C_{eff} - \tau} \quad (8)$$

In the case where the voltage change is an increase in the voltage, similar equations may be derived. The time constant measurement works in the same manner.

Similarly, different configurations may be implemented for measuring the time constant. The leakage measurement circuit 102, 104 may be connected to either the battery side or the load side of the contactors 42. When the leakage measurement circuit 102, 104 is connected to the load side of the contactor 42, the voltage decay may be measured when the contactor 42 is opened by closing the switching element S1 110 before the contactor 42 is opened. In this case, the voltage may decay to zero volts (e.g., $V_{final} = 0$). Note that the above discussion applies to the lower portion of the leakage measurement circuit 106, 108 that are coupled using switching element S2 112.

The equations have been shown for the leakage measurement circuit coupled to the positive terminal 122, but the equations are similar for the leakage measurement circuit coupled to the negative terminal 128. The same equations are derived when $R_3 = R_2$ and $R_4 = R_1$.

One may estimate the time constant for each of the leakage measurement circuits and use an average time constant in the equation to calculate $R_{equiv}$. This may reduce the number of calculations that are necessary as the equivalent leakage resistance is only calculated once per measurement cycle.

When the equivalent leakage resistance is less than a predetermined value, a diagnostic condition may be indicated. For example, a diagnostic warning lamp may be illuminated to alert the operator to the condition. In addition, a diagnostic trouble code may be stored in non-volatile memory for later diagnosis. Finally, operation of the vehicle may be inhibited when the condition has been detected.

Under normal conditions, the leakage resistances may be relatively large values that are approximately equal to one another such that the voltage across each of the leakage measurement circuits is approximately one half of the total battery voltage. This may also represent the voltage across the capacitors. The resistance values of the leakage measurement circuit may be selected to scale the voltage to a level that is readable by the microprocessor.

The leakage measurement may be performed during vehicle shutdown. Performing the leakage measurement test at this time does not interfere with normal vehicle operation. This timing also allows the high voltage loads to be switched off so that the leakage measurement is not impacted by these loads. A diagnostic condition may be stored in non-volatile memory and may be present upon powering up during a subsequent ignition cycle.

The logic described may be implemented as instructions in the controller 76. The controller 76 may have outputs to control the switching elements 110, 112. A controller implemented method as described may implemented to output a diagnostic signal based on the leakage resistance. The controller 76 may detect when appropriate conditions are present to activate the switching elements 110, 112. An appropriate condition may be when the end of an ignition cycle is detected, such as when the ignition is switched off.

When the appropriate conditions are met, the high-side leakage switching element 110 may be activated to couple the resistive network in parallel with the high-side capacitor 136. The switching element 110 may be activated for a predetermined amount of time. While the switching element 110 is activated, the voltage across the voltage measurement resistor 104 may be measured and stored. After the predetermined time, the switching element 110 may be deactivated and the stored voltage readings may be processed to determine the time constant as detailed above. The leakage resistance value may then be calculated based on the time constant.

The process may then be repeated in the same manner for the low-side switching element 112. An average of the high-side leakage result and the low-side leakage result may be used to determine the diagnostic setting.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a capacitor connected between a voltage bus and a chassis of the vehicle; and
   at least one controller programmed to, in response to activating a switching element to couple a resistive network in parallel with the capacitor for a predetermined time, output a diagnostic according to a leakage resistance estimate that is based on a time associated with a predetermined change in a voltage across the capacitor.

2. The vehicle of claim 1 wherein the predetermined change is defined by a product of (1−1/e), where e is Euler's number, and a magnitude of a difference between an initial voltage across the capacitor and a final voltage across the capacitor.

3. The vehicle of claim 2 wherein the initial voltage is the voltage at a time immediately after activating the switching element.

4. The vehicle of claim 2 wherein the final voltage is the voltage at the predetermined time, and wherein the predetermined time is such that a rate of change of the voltage with respect to time is approximately zero at the predetermined time.

5. The vehicle of claim 1 wherein the leakage resistance estimate is further based on a capacitance of the capacitor.

6. The vehicle of claim 1 wherein the resistive network includes a current limiting resistor and a voltage measurement resistor connected in series, and wherein the voltage across the capacitor is proportional to a voltage across the voltage measurement resistor.

7. The vehicle of claim 1 wherein the leakage resistance estimate is a parallel combination of a first leakage resistance between a positive terminal of the voltage bus and the chassis of the vehicle and a second leakage resistance between a negative terminal of the voltage bus and the chassis of the vehicle.

8. The vehicle of claim 1 wherein the at least one controller is further programmed to output the diagnostic when the leakage resistance estimate is less than a predetermined resistance.

9. A battery management system comprising:
   a switching element configured to selectively couple a resistive network in parallel with a capacitor that couples a voltage bus and a ground reference; and
   at least one controller programmed to, in response to the selective coupling exceeding a predetermined time, output a diagnostic according to a leakage resistance estimate that is based on a time associated with a predetermined change in a voltage across the capacitor.

10. The battery management system of claim 9 wherein the resistive network includes a current limiting resistor and a voltage measurement resistor connected in series, wherein the voltage across the capacitor is proportional to a voltage across the voltage measurement resistor.

11. The battery management system of claim 9 wherein the predetermined change is defined by a product of (1−1/e), where e is Euler's number, and a magnitude of a difference between an initial voltage across the capacitor and a final voltage across the capacitor.

12. The battery management system of claim 11 wherein the initial voltage is the voltage at a time immediately after the coupling.

13. The battery management system of claim 11 wherein the final voltage is the voltage at the predetermined time, and wherein the predetermined time is such that a rate of change of the voltage with respect to time is approximately zero at the predetermined time.

14. The battery management system of claim 9 wherein the leakage resistance estimate is further based on a capacitance of the capacitor.

15. The battery management system of claim 9 wherein the at least one controller is further programmed to activate the switching element in response to a signal indicative of an end of an ignition cycle.

16. The battery management system of claim 9 wherein the leakage resistance estimate is based on a parallel combination of a first leakage resistance between a positive terminal of the voltage bus and the ground reference and a second leakage resistance between a negative terminal of the voltage bus and the ground reference.

17. The battery management system of claim 9 wherein the at least one controller is further programmed to output the diagnostic when the leakage resistance estimate is less than a predetermined resistance.

18. A method comprising:
    coupling, by a controller, a resistor network in parallel with a capacitor that couples a voltage bus and a chassis of a vehicle for a predetermined time; and
    outputting, by the controller, a leakage resistance value based on a time for a voltage across the capacitor to change by a predetermined amount.

19. The method of claim 18 wherein the predetermined amount is defined by a product of (1−1/e), where e is Euler's number, and a magnitude of a difference between an initial voltage and a final voltage.

20. The method of claim 19 wherein the final voltage is less than the initial voltage.

* * * * *